(12) United States Patent
Gabele et al.

(10) Patent No.: US 6,230,302 B1
(45) Date of Patent: May 8, 2001

(54) METHOD AND SYSTEM FOR PERFORMING TIMING ANALYSIS ON AN INTEGRATED CIRCUIT DESIGN

(75) Inventors: Carol Ivash Gabele; Stephen Thomas Quay, both of Austin; Paul Gerard Villarrubia, Round Rock; Parsotam Trikam Patel; Alexander Koos Spencer, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/119,271

(22) Filed: Jul. 20, 1998

(51) Int. Cl.[7] .................................................. G06F 17/50
(52) U.S. Cl. .................................................. 716/6; 703/19
(58) Field of Search ........................ 395/500.02–500.19, 395/500.35–500.37, 500.4; 716/1–21; 703/14–16, 19

(56) References Cited

U.S. PATENT DOCUMENTS

| | | | |
|---|---|---|---|
| 5,367,469 | * 11/1994 | Hartoog | 716/10 |
| 5,764,531 | * 6/1998 | Kojima et al. | 716/6 |
| 5,787,008 | * 7/1998 | Pullela et al. | 703/19 |
| 5,845,233 | * 12/1998 | Fishburn | 702/108 |
| 5,896,300 | * 4/1999 | Raghavan et al. | 716/10 |
| 5,933,356 | * 8/1999 | Rostoker et al. | 703/15 |
| 6,009,248 | * 12/1999 | Sato et al. | 716/2 |
| 6,023,568 | * 2/2000 | Segal | 716/6 |

OTHER PUBLICATIONS

Gupta et al. ("The Elmore delay as a bound for RC trees with generalized input signals", IEEE Transactions on Computer–Aided Design of integrated Circuits and Systems, vol. 16, No. 1, Jan. 1997, pp. 95–104), Jan. 1997.*

Fernandez et al. ("Clock period optimization in a multiphase edge–clocked circuit constrained to a maximum number of phases", Proceedings of the 23rd Euromicro Conference on New Frontiers of Information Technology Short Contributions, EUROMICRO 97, Sep. 1, 1997.*

* cited by examiner

Primary Examiner—Matthew Smith
Assistant Examiner—Phallaka Kik
(74) Attorney, Agent, or Firm—Anthony V.S. England; Felsman, Bradley, Vaden, Gunter & Dillon, LLP

(57) ABSTRACT

A method and system for performing timing analysis on an integrated circuit design are disclosed. It is always advantageous to be able to conveniently perform a timing analysis on the entire IC design at any stage of the design process in order to gain more accurate timing information about the design. However, at an early stage of the design process, the available physical circuit data are often incomplete, not to mention these preliminary data are usually of a lower quality as far as capability of providing an accurate RC delay and capacitance estimation is concerned. To make the best usage of the preliminary data, the present disclosure describes a method of performing a fleeting timing analysis that can be very useful during an early floor planning stage of the design process when there is no opportunity to buffer or widen any exceptionally long interconnect wires within the IC circuit design. As a result, much faster design turn-around time may be achieved because buffer insertion need not be run for every new pass of the physical circuit design data.

9 Claims, 5 Drawing Sheets

METHOD AND SYSTEM FOR PERFORMING TIMING ANALYSIS ON AN INTEGRATED CIRCUIT DESIGN

BACKGROUND OF THE INVENTION

1. Technical Field

The present invention relates to a method and system for integrated circuit design in general and, in particular, to an automated method and system for integrated circuit design. Still more particularly, the present invention relates to an automated method and system for performing timing analysis on an integrated circuit design.

2. Description of the Prior Art

Logic synthesis has now become an integral part of an integrated circuit (IC) design automation process. A logic synthesis system typically contains various analysis programs (or analysis tools), each intended for achieving a different purpose, such as logic design, circuit area targeting, timing and delay analysis, etc. These analysis programs play an important role in the design automation process, both in their own right as well as part of a logic synthesis system that utilizes them to evaluate the quality of various synthesized circuits extracted from the IC design.

Generally speaking, a timing analysis program analyzes the temporal behavior of an IC design by determining when a timing event occurs within the IC design. For example, in a synchronized digital system design, the timing analysis program is utilized to determine the delay of a combinational part of an IC design. The delay of the combinational circuit is the time taken for the outputs of the combinational circuit to settle at a final value after the inputs have been applied. This delay, in turn, is utilized to determined the minimal permissible clocking period of the entire digital system design.

Before timing analysis is performed, RC delays and capacitance on an IC design are calculated on a per net basis by an IC design extraction program. The results from such calculation are then fed into a timing analysis program such that various cycle times of the IC design can be determined. One problem with the prior art timing analysis programs is that they typically take an extensive amount of time to generate a complete set of physical data for the entire IC design. Thus, most circuit designers often defer the full-cycle of creating the complete set of physical data in order to gain extra design time. Even though such a solution may be acceptable at times, it is always advantageous to be able to conveniently perform a timing analysis on the entire IC design in order to gain more accurate timing information about the design at any stage of the design process. Hence, it would be desirable to provide an improved method and system for performing timing analysis on an IC design in order to facilitate the IC design automation process.

SUMMARY OF THE INVENTION

In view of the foregoing, it is therefore an object of the present invention to provide an improved method and system for designing integrated circuits.

It is another object of the present invention to provide an improved automated method and system for integrated circuit design.

It is yet another object of the present invention to provide an improved automated method and system for performing timing analysis on an integrated circuit design.

In accordance with a method and system of the present invention, a set of circuit data is extracted from an integrated circuit design. For a number of network within the set of circuit data, a determination is made as to whether or not design criteria are met. For the networks within the set of circuit data, a set of timing parameters is selectively altered if the design criteria are not met. Finally, a timing analysis is performed on the set of circuit data utilizing the selectively altered set of timing parameters.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a midrange computer or in a mainframe computer under a number of different operating systems. In addition, the computer may be a stand-alone system or part of a network such as a local-area network (LAN) or a wide-area network (WAN). For the purpose of illustration, a preferred embodiment of the present invention, as described below, is implemented on an RS/6000™ computer, manufactured by International Business Machines Corporation of Armonk, New York.

Figure 1:
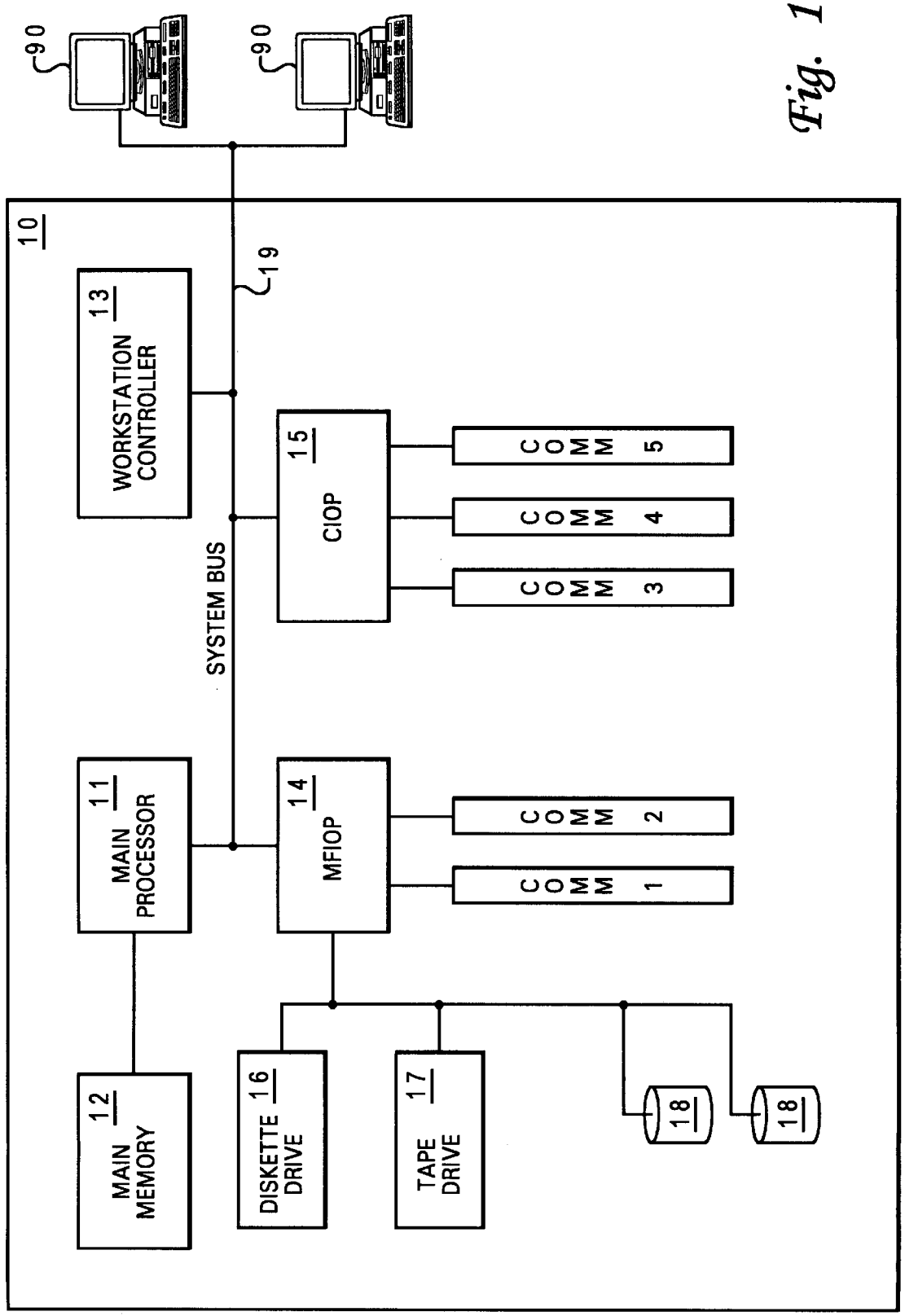
FIG. 1 is a block diagram of a computer system that may be utilized by a preferred embodiment of the invention.

Referring now to the drawings and, in particular, to FIG. 1, there is illustrated a block diagram of a computer system that may be utilized by a preferred embodiment of the invention. Within computer box 10, main processor 11 is coupled to a main memory 12 and a multiple-function I/O processor (MFIOP) 14. Main processor 11 may include a single processor or multiple processors. Several peripheral storage devices such as diskette drive 16, tape drive 17, and direct access storage devices (DASDs) 18, are controlled by MFIOP 14. In addition, MFIOP 14 provides communications to other devices via communication ports such as COMM 1 and COMM 2.

Attached to system bus 19 are a workstation controller 13 and a communications I/O processor (CIOP) 15. Workstation controller 13 provides communications between main processor 11 and workstation(s) 90 that may be connected to the computer system. CIOP 15 provides communications to other devices via communication ports such as COMM3, COMM4, and COMM5.

As mentioned in the background section of the present disclosure, it is always advantageous to be able to conveniently perform a timing analysis on the entire IC design at any stage of the design process in order to gain more accurate timing information about the design. However, at an early stage of the design process, the available physical circuit data are often incomplete, not to mention these preliminary data are usually of a lower quality as far as capability of providing an accurate RC delay and capacitance estimation is concerned. To make the best usage of the preliminary data, the present disclosure describes a method of performing a fleeting timing analysis that can be very useful during an early floor planning stage of the design process when there is no opportunity to buffer or widen any exceptionally long interconnect wires within the IC circuit design. In essence, the disclosed method effectively filters all nets that can have their high delay or capacitance reduced through buffer insertion or wire widening techniques. When utilizing the disclosed method, a circuit designer can focus his/her attention on the more critical nets first. As a result, much faster design turn-around time may be achieved because buffer insertion need not be run for every new pass of the physical circuit design data.

Figure 2:
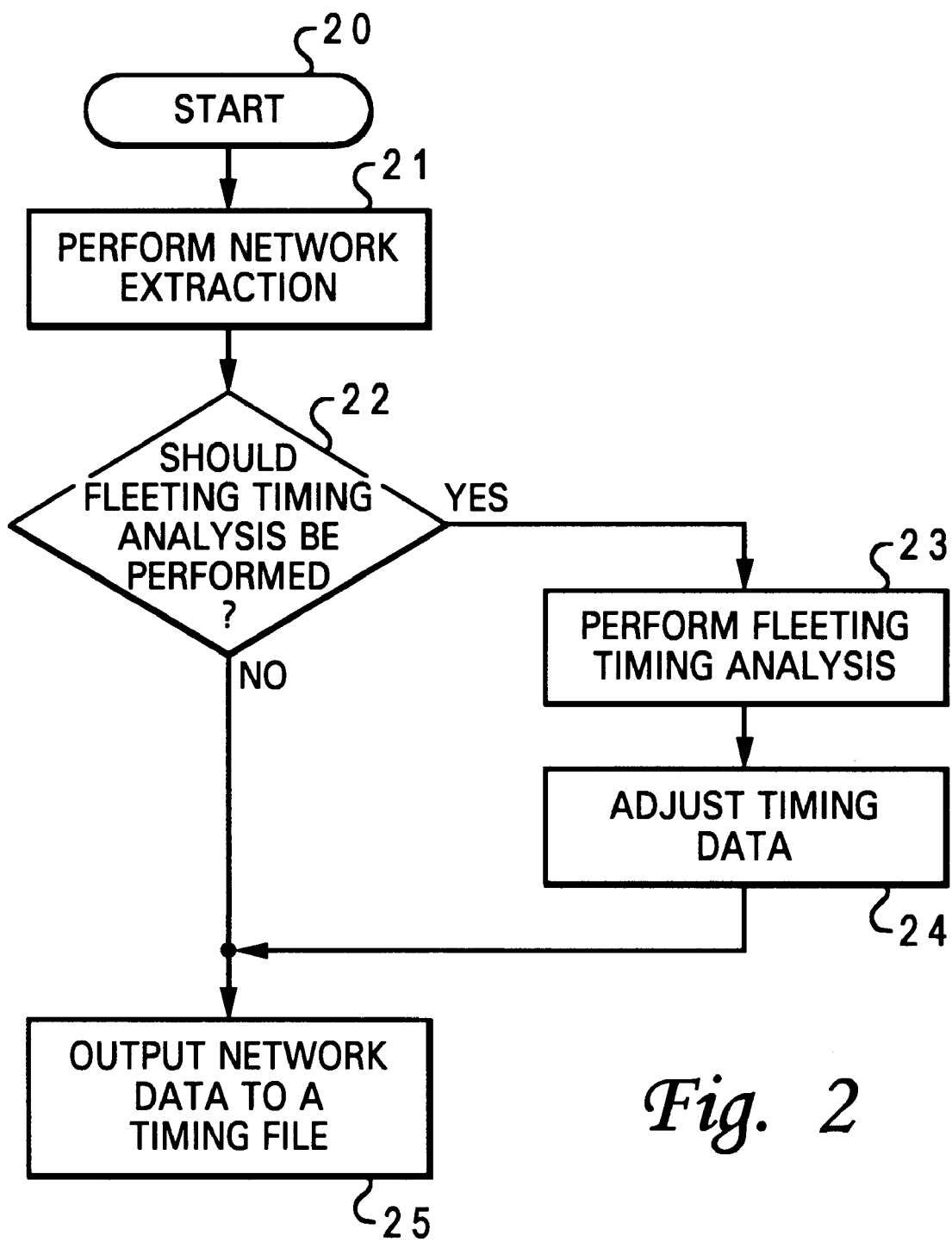
FIG. 2 is a high-level flow diagram illustrating a method for performing a timing analysis on an integrated-circuit designs in accordance with a preferred embodiment of the present invention.

With reference now to FIG. 2, there is depicted a high-level flow diagram illustrating a method for performing a timing analysis on an integrated-circuit design, in accordance with a preferred embodiment of the present invention. Starting at block 20, a network extraction is performed to a set of network data, as depicted in block 21. The network data can come from any stage of the design process. A determination is then made as to whether or not a fleeting timing analysis should be performed on the extracted network data, as illustrated in block 22. If the fleeting timing analysis should not be performed on the extracted network data, the extracted network data is output to a timing file, as shown in block 25. Otherwise, if the fleeting timing analysis should be performed on the extracted s network data, the fleeting timing analysis is performed, as depicted in block 23, and the timing data of the extracted network data will be adjusted according to the fleeting timing analysis, as depicted in block 24, before the network data is output to the timing file, as illustrated in block 25.

Herein, two methods—a preferred method and an alternative method—are described for performing the above-mentioned fleeting timing analysis. Although each method is intended for certain different net topologies, the preferred method is simpler and faster to execute but less accurate, while the alternative method is more accurate and more time consuming to execute. This is because the alternative method considers all wire resistances and the topology of sinks of the entire circuit design.

Figure 3:
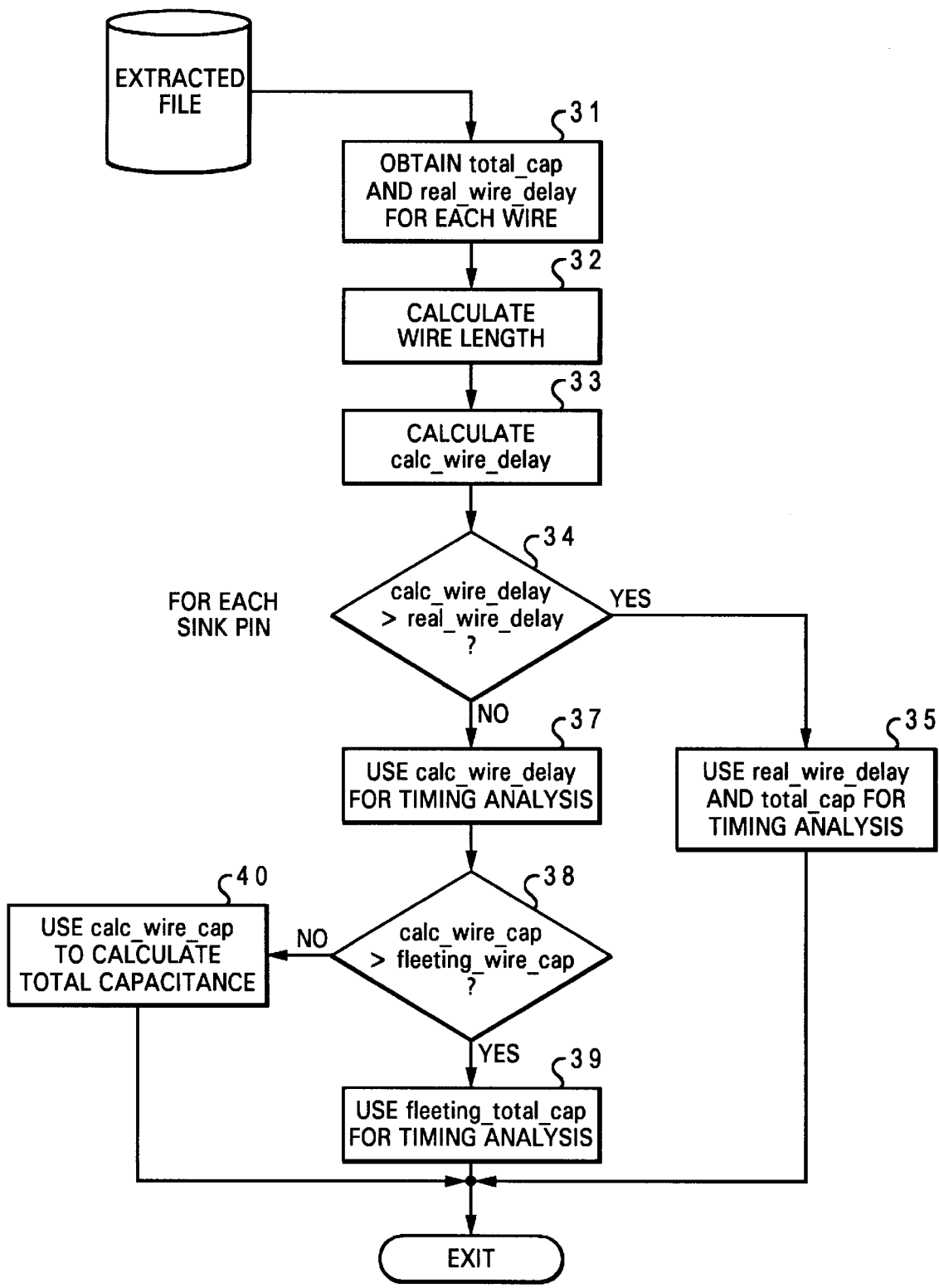
FIG. 3 is a high-level logic flow diagram illustrating a method for performing a fleeting timing analysis on an integrated-circuit design, in accordance with a preferred embodiment of the present invention.

Referring now to FIG. 3, there is depicted a high-level logic flow diagram illustrating a method for performing a fleeting timing analysis on an IC design, in accordance with a preferred embodiment of the present invention. First, for each net, a total capacitance, total_cap, and a real wire delay for each sink pin in the net, real_wire_delay, are obtained from the extracted file (from block 21 of FIG. 2), as shown in block 31. The sum of the lengths of the wires in each extracted net, wire_length, is then calculated, as depicted in block 32. An ideal wire delay for each extracted net is then determined, as illustrated in block 33. The ideal wire delay, calc_wire_delay, is determined by the following equation:

$$calc\_wire\_delay = wire\_length * fleeting\_time$$

where wire_length (mm) is obtained from block 32, and fleeting_time (ps/mm) is a parameter input by a circuit designer, based on the timing characteristics of a specific design technology and a previous analysis of the lowest wire delay possible when optimal buffering has been performed.

For each net, a determination is made as to whether or not the calc_wire_delay is greater than the real_wire_delay for every sink pin within the net, as shown in block 34. If the calc_wire_delay is greater than the real_wire_delay for every sink pin within the net, then the real_wire_delay of the sink pin and the total_cap of the net are utilized for timing analysis, as illustrated in block 35.

Otherwise, if the calc_wire_delay is less than the real_wire_delay, then the calc_wire_delay of the sink pin is utilized for timing analysis, as depicted in block 37; and a subsequent determination is made as to whether or not the calc_wire_cap of the net is greater than a fleeting_wire_cap—a value specified by the circuit designer to be the maximum wire capacitance allowed for any network, as depicted in block 38. If the calc_wire_cap is greater than the fleeting_wire_cap, then a fleeting_total_cap is utilized for timing analysis, as illustrated in block 39. The fleeting_total_cap is a parameter defined by the circuit designer. Otherwise, the calc_wire_cap is utilized to calculate the total capacitance of the network for the purpose of timing analysis, as shown in block 40. The total capacitance can be calculated by adding calc_wire_cap to the sink pin capacitance.

Figure 4:
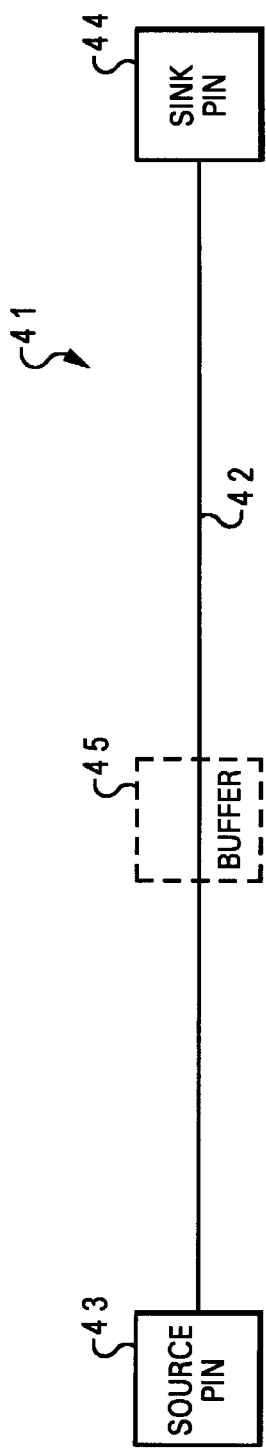
FIG. 4 is a pictorial diagram of a net that is suitable for the performance of a fleeting timing analysis in accordance with the preferred embodiment of the present invention.

This preferred method of performing a fleeting timing analysis is particularly effective for a net that is similar to a net 41 depicted in FIG. 4. As shown, net 41 has a long wire 42 connecting a source pin 43 and a sink pin 44. The characteristic of net 41 includes long wires that would yield a very large RC delay and a high capacitance. Because of the very large RC delay and high capacitance, a prior art timing analysis program would have put a "timing error flag" on net 41 unless buffers are inserted between source and sink pins. By using the preferred method of performing a fleeting timing analysis as described above, such a "timing error flag" can be avoided, with an understanding that one or more buffers (such as a buffer 45) will be added to net 41 at a later stage of the design process.

Figure 5:
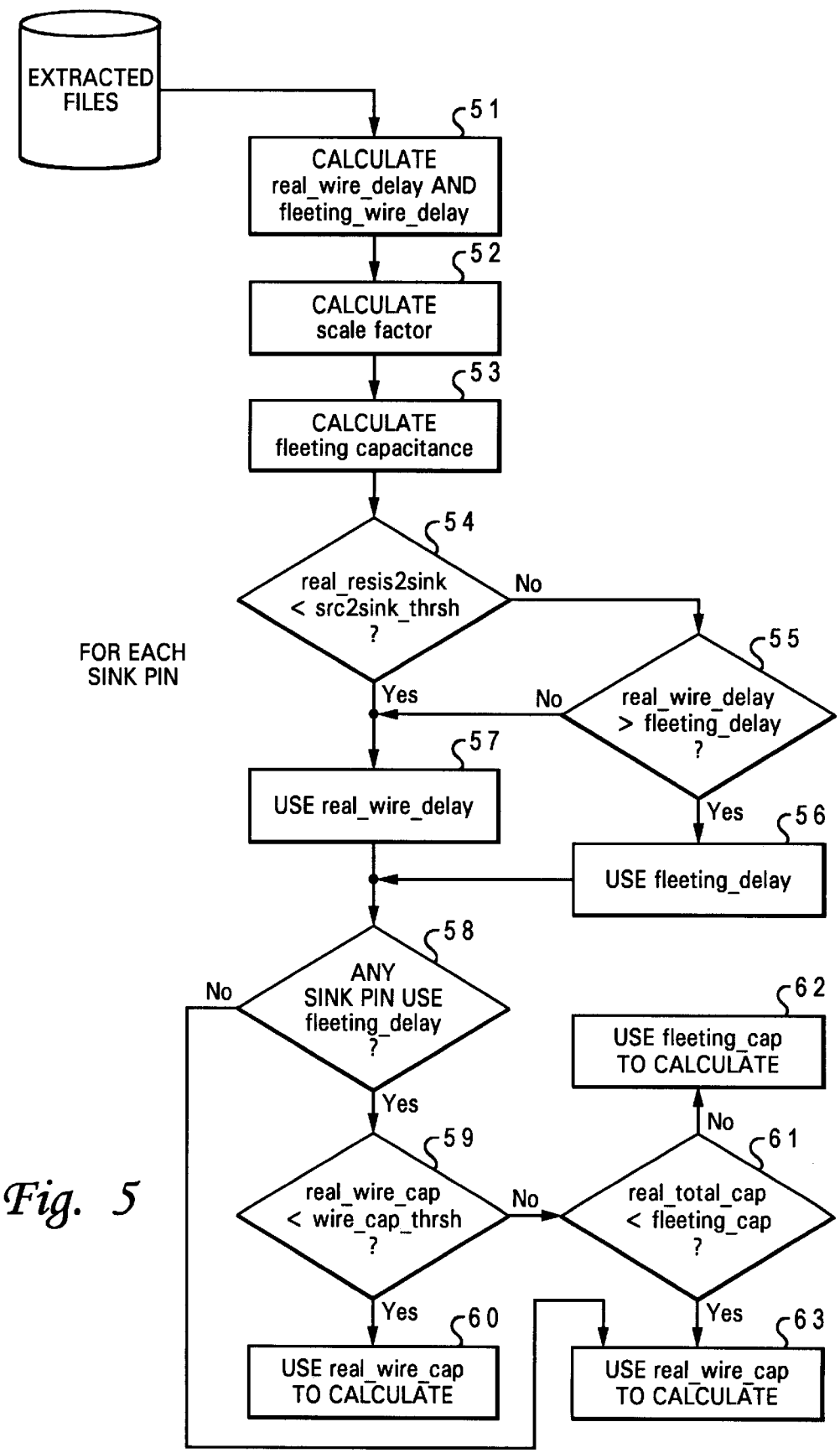
FIG. 5 is a high-level logic flow diagram illustrating a method for performing a fleeting timing analysis on an integrated-circuit design, in accordance with an alternative embodiment of the present invention.

Referring now to FIG. 5, there is depicted a high-level logic flow diagram illustrating a method for performing a fleeting timing analysis, in accordance with an alternative embodiment of the present invention. In this method, inputs from the user (e.g., the circuit designer) preferably include: (1) source to sink threshold, src2sink_thrsh (ohm), (2) fleeting time, fleeting_time (ps/ohm), (3) wire capacitance threshold, wire_cap_thrsh (ff), and (4) buffer capacitance, buffer_cap (ff). First, for each pin, a real wire delay, real_wire_delay, and a fleeting wire delay, fleeting_wire_delay, are determined based on the data in the extracted file (from block 21 of FIG. 2), as shown in block 51. The fleeting_wire_delay is calculated as follows:

$$fleeting\_wire\_delay = real\_resis2sink * fleeting\_time$$

The real resistance to sink, real_resis2sink, can be calculated from the data in the extracted file. Then, a scale factor is determined, as depicted in block 52, as follows:

$$scale\ factor = \frac{total\_wire\_resistance}{\sum source\_to\_sink\ resistances}$$

A fleeting capacitance, fleeting_cap, is determined, as depicted in block 53, by:

$$fleeting\_cap = buffer\_cap * number\ of\ sinks * scale\ factor$$

A determination is made as to whether or not the real_resis2sink is less than src2sink_thrsh, as shown in block 54. If the real_resis2sink is less than src2sink_thrsh, then the real_wire_delay will be utilized, as depicted in block 57. Otherwise, another determination is made as to whether or not the real_wire_delay is greater than fleeting_delay, as illustrated in block 55. If the real_wire_delay is greater than fleeting_delay, then the fleeting_delay is utilized, as shown in block 56. Otherwise, the real_wire_delay will be utilized, as depicted in block 57.

Subsequently, a determination is made as to whether or not a fleeting_delay is used by any sink pin, as shown in block 58. If so, another determination is made as to whether or not the real_wire_cap is less than wire_cap_thrsh, as shown in block 59. If the real_wire_cap is less than wire_cap_thrsh, then the real_wire_cap is utilized to calculate the total capacitance of this pin, as depicted in block 60. Otherwise, yet another determination is made as to whether or not the real_total_cap is less than the fleeting_cap, as illustrated in block 61. If the real_total_cap is greater than the fleeting_cap, then the fleeting_cap value is utilized as the total capacitance for this net, as shown in block 62; otherwise the real_total_cap is utilized as the total capacitance for this net, as depicted in block 63.

Figure 6:
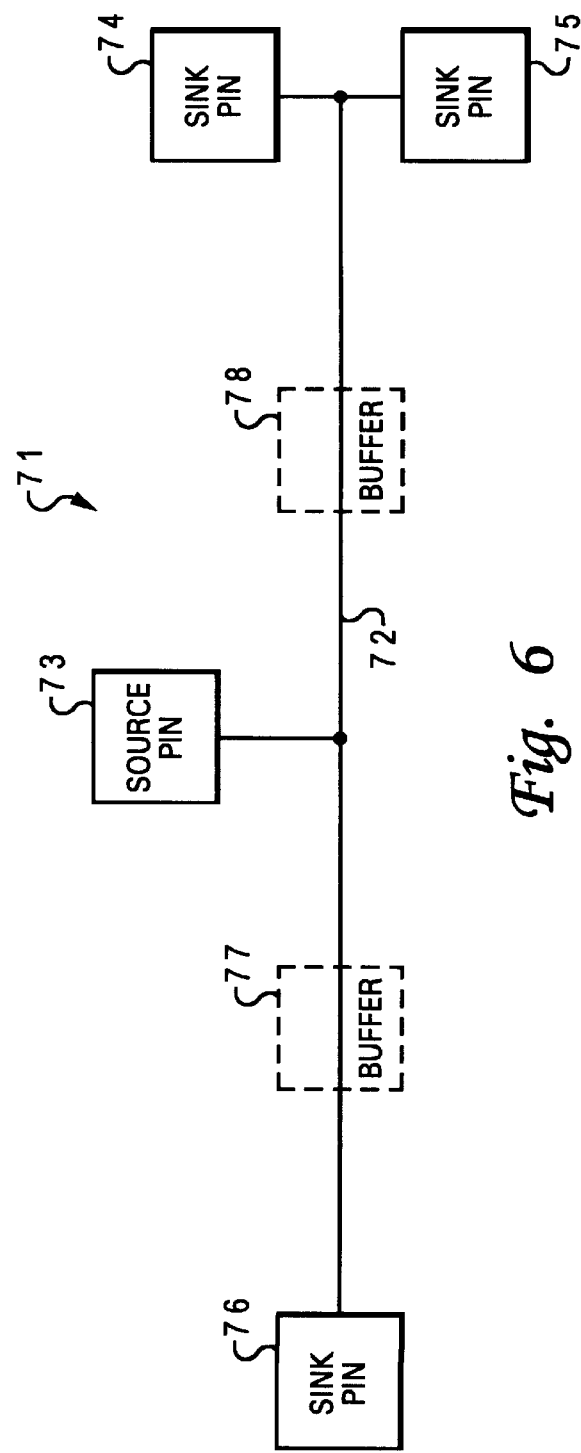
FIG. 6 is a pictorial diagram of a net that is suitable for the performance of a fleeting timing analysis in accordance with the alternative embodiment of the present invention.

This alternative method of performing a fleeting timing analysis is particularly effective for a net that is similar to a net 71 depicted in FIG. 6. As shown, net 71 has a long wire 72 connecting a source pin 73 and sink pins 74–76. The characteristic of net 71 includes long wires coupled to multiple sinks. Because of the very large RC delay and high capacitance, a prior art timing analysis program would have put "timing error flags" on net 71 unless buffers are inserted between source and sink pins. By using the alternative method of performing a fleeting timing analysis as described above, those "timing error flags" can be avoided, with an understanding that one or more buffers (such as buffers 77, 78) will be added to net 71 at a later stage of the design process.

For circuits similar to net 71, the preferred method as described previously is less accurate than the alternative method when comes to predicting the final delay through the network after buffers are inserted because of the following reasons. First, resistance in a wire network is usually proportional to wire length. However, different wire thickness and width are also factored within wire resistance. If wire 72 becomes a wide wire, the resistance decreases and the network delay after buffering also decreases (decreased RC wire delay). The preferred method would not be able to predict this decrease in delay because the length of wire 72 remains constant. The alternative method, however, would appropriately predict the decreased network delay because the fleeting delay is proportional to the decreased path resistance. Further, first order methods of calculating RC wire delay (such as Elmore delay) from the source to the sink calculate the wire delay as a function of resistance in the path from the source to the sink. In addition, the preferred method does not account for circuit branches. For example, wire 72 of FIG. 6 has a left branch and a right branch. The preferred method would use the total length of both branches to calculate the buffered network delay to all the sinks. This calculated wire delay would be too pessimistic. The alternative method calculates the right branch's resistance to compute the buffered network delay to the right sinks, and the left branch for the left sinks. Finally, the preferred method utilizes a fixed value for fleeting wire capacitance, and assumes the source will drive a single length that terminates in a single buffer. The fleeting capacitance calculation in the alternative method, on the other hand, more correctly predicts that the source will be driving at least two wire branches terminated by at least two buffers.

As has been described, the present invention provides an improved method for performing timing analysis on an integrated-circuit design. The present invention permits the delay of a long or not yet widened wire to be eliminated as if buffering or wire widening had already been performed. This reduces the number of failing nets a circuit designer has to wade through after a timing analysis during the earlier stages of a circuit design. In addition, with a higher degree of accuracy that is based on a network's topology, the turn around time in the design process can be greatly reduced. Further, timing information can be conveniently provided by utilizing preliminary wiring data as input.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for performing timing analysis on an integrated circuit design, said method comprising the steps of:

extracting a set of circuit data from said integrated circuit design;

for a wire representation in a network within said set of circuit data, determining whether or not said wire representation's time delay is greater than design criteria;

if said time delay is greater than said design criteria, determining said time delay of said wire representation as if buffers have been inserted in said wire representation by using a fleeting wire capacitance calculation; and performing a timing analysis on said set of circuit data using said fleeting wire capacitance calculation without inserting any buffer in said wire representation.

2. The method according to claim 1, wherein said fleeting wire capacitance calculation is calculated by buffer capacitance*number of sinks*scale factor.

3. The method according to claim 2, wherein said scale factor is calculated by total_wire_resistance/total source_to_sink resistance.

4. A computer system capable of performing timing analysis on an integrated circuit design, said computer system comprising:

means for extracting a set of circuit data from said integrated circuit design;

means for determining whether or not a time delay of a wire representation in a network is greater than design criteria;

means for determining said time delay as if buffers have been inserted in said wire representation by using a fleeting wire capacitance calculation when said time delay is greater than said design criteria; and means for performing a timing analysis on said set of circuit data using said fleeting wire capacitance calculation without inserting any buffer in said wire representation.

5. The computer system according to claim 4, wherein said computer system further includes a means for determining whether or not a calculated wire capacitance is greater than a fleeting wire capacitance, wherein said fleeting wire capacitance=buffer capacitance*number of sinks*scale factor.

6. The computer system according to claim 5, wherein said scale factor is calculated by total_wire resistance/total source_to_sink resistance.

7. A computer program product residing on a computer usable medium for performing timing analysis on an integrated circuit design, said computer program product comprising:

program code means for extracting a set of circuit data from said integrated circuit design;

program code means for determining whether or not a time delay of a wire representation in a network is greater than design criteria;

program code means for determining said time delay as if buffers have been inserted in said wire representation by using a fleeting wire capacitance calculation when said time delay is greater than said design criteria; and program code means for performing a timing analysis on said set of circuit data using said fleeting wire capacitance calculation without inserting any buffer in said wire representation.

8. The computer program product according to claim 7, wherein said computer program product further includes a program code means for determining whether or not a calculated wire capacitance is greater than a fleeting wire capacitance, wherein said fleeting wire capacitance=buffer capacitance*number of sinks*scale factor.

9. The computer program product according to claim 8, wherein said scale factor is calculated by total_wire_resistance/total source_to_sink resistance.

* * * * *